US012577654B2

(12) United States Patent
Park et al.

(10) Patent No.: US 12,577,654 B2
(45) Date of Patent: Mar. 17, 2026

(54) MOLECULAR BEAM EPITAXY THIN FILM GROWTH APPARATUS

(71) Applicants: UNIVERSITY OF ULSAN FOUNDATION FOR INDUSTRY COOPERATION, Ulsan (KR); Eun Jung Park, Busan (KR)

(72) Inventors: Eun Jung Park, Busan (KR); Sun Lae Cho, Busan (KR); Eun Ji Park, Gyeongsangnam-do (KR)

(73) Assignees: Eun Park, Busan (KR); UNIVERSITY OF ULSAN FOUNDATION FOR INDUSTRY COOPERATION, Ulsan (KR)

( * ) Notice: Subject to any disclaimer, the term of this patent is extended or adjusted under 35 U.S.C. 154(b) by 446 days.

(21) Appl. No.: 18/272,994

(22) PCT Filed: Jan. 29, 2021

(86) PCT No.: PCT/KR2021/001242
§ 371 (c)(1),
(2) Date: Jul. 18, 2023

(87) PCT Pub. No.: WO2022/158630
PCT Pub. Date: Jul. 28, 2022

(65) Prior Publication Data
US 2024/0084442 A1 Mar. 14, 2024

(30) Foreign Application Priority Data
Jan. 21, 2021 (KR) .......................... 1020210008548

(51) Int. Cl.
C23C 14/56 (2006.01)
C23C 14/28 (2006.01)
(Continued)

(52) U.S. Cl.
CPC ............ *C23C 14/566* (2013.01); *C23C 14/28* (2013.01); *C23C 14/505* (2013.01); *C30B 23/063* (2013.01)

(58) Field of Classification Search
CPC ..... C23C 14/28; C23C 14/505; C23C 14/566; C30B 23/02; C30B 23/06; C30B 23/063;
(Continued)

(56) References Cited

U.S. PATENT DOCUMENTS 4,542,712 A * 9/1985 Sato ...................... C30B 35/005
414/217
4,605,469 A * 8/1986 Shih ........................ C30B 23/02
414/217
(Continued)

FOREIGN PATENT DOCUMENTS

JP 06009297 A 1/1994
JP 07176493 A 7/1995
(Continued)

OTHER PUBLICATIONS

KR10-2021-0008548, First Office Action, dated Apr. 25, 2022.

*Primary Examiner* — Benjamin Kendall
(74) *Attorney, Agent, or Firm* — Myers Bigel, P.A

(57) ABSTRACT

Disclosed is a molecular beam epitaxy (MBE) thin film growth apparatus. The MBE thin film growth apparatus includes a growth chamber which is connected to a vacuum pump and of which an inside is maintained in an ultra-high vacuum state, a substrate manipulator which is provided inside the growth chamber and on which a substrate is mounted, a load-lock chamber which is provided outside the growth chamber and communicates with the growth chamber and in which at least one substrate, which is mounted on the substrate manipulator, for growing a thin film is located, and a substrate transfer rod that transfers the substrate from the load-lock chamber to the growth chamber or from the
(Continued)

growth chamber to the load-lock chamber, wherein the load-lock chamber is disposed to face the substrate manipulator and disposed collinear with a substrate transfer path of the substrate transfer rod.

16 Claims, 13 Drawing Sheets

(51) Int. Cl.
     *C23C 14/50*          (2006.01)
     *C30B 23/06*          (2006.01)

(58) Field of Classification Search
     CPC ....... C30B 25/02; C30B 25/08; C30B 25/105;
              C30B 25/12; C30B 35/002; C30B 35/005;
                  H01L 21/67201; H01L 21/67763; H01L
                                      21/67769
     See application file for complete search history.

(56)                References Cited

U.S. PATENT DOCUMENTS

| | | | | |
|---|---|---|---|---|
| 5,556,472 | A | * | 9/1996 | Nakamura .............. C23C 14/24 |
| | | | | 204/298.25 |
| 5,662,469 | A | * | 9/1997 | Okase ................. C23C 16/4583 |
| | | | | 432/6 |

FOREIGN PATENT DOCUMENTS

| | | | |
|---|---|---|---|
| JP | 10303147 | A | 11/1998 |
| JP | 2009117466 | A | 5/2009 |
| KR | 1019930010751 | B1 | 11/1993 |
| KR | 1019980077717 | A | 11/1998 |

* cited by examiner

【FIG. 1】
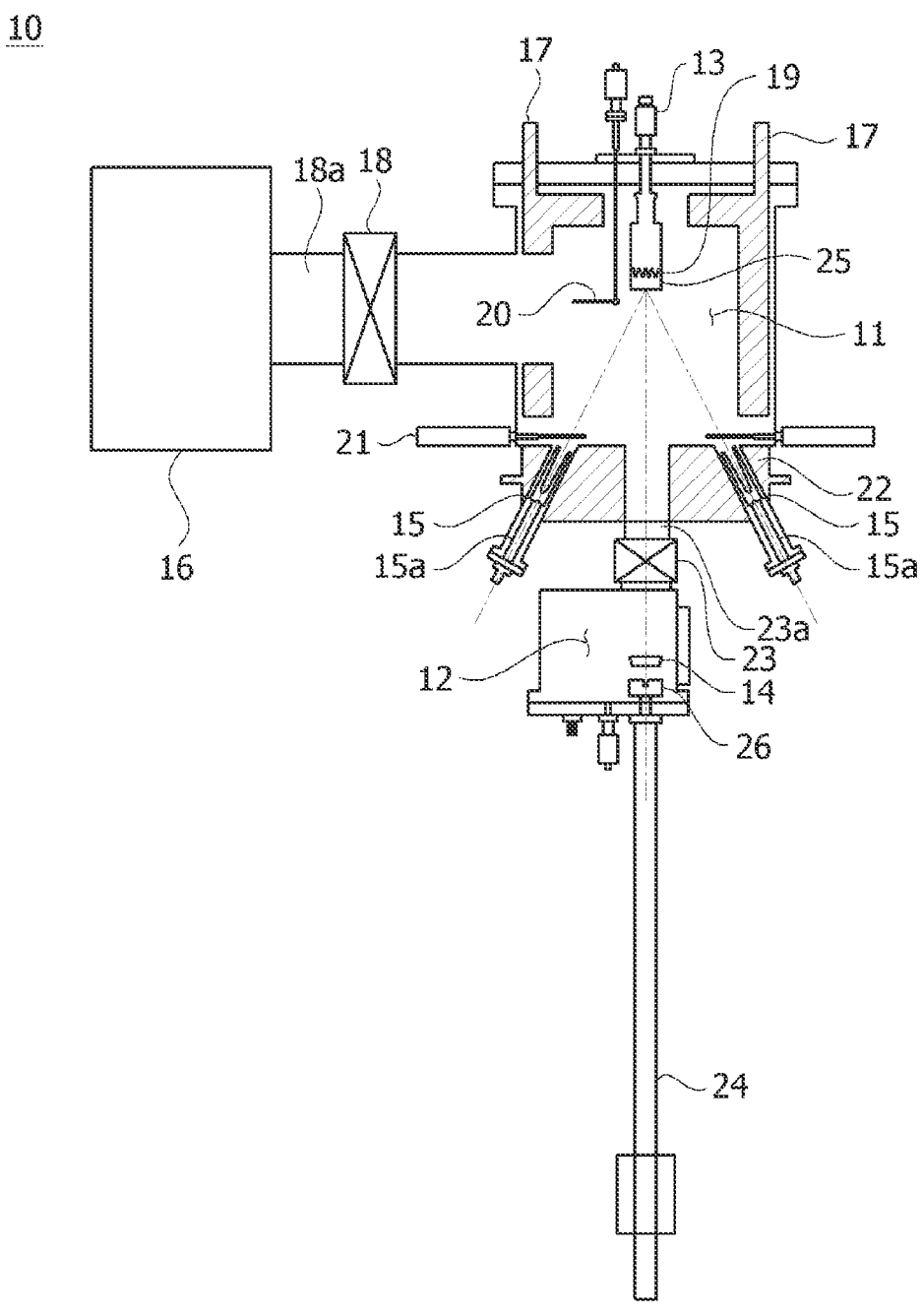

[FIG. 2]
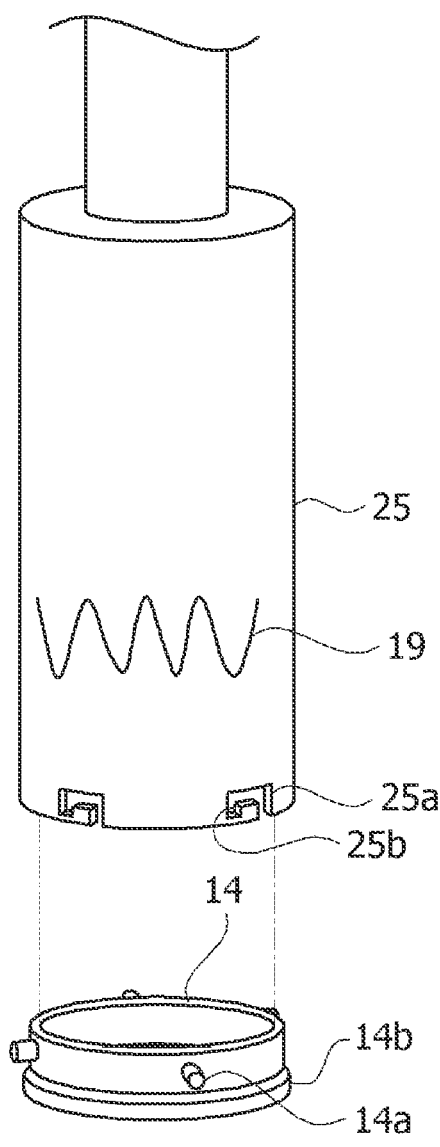

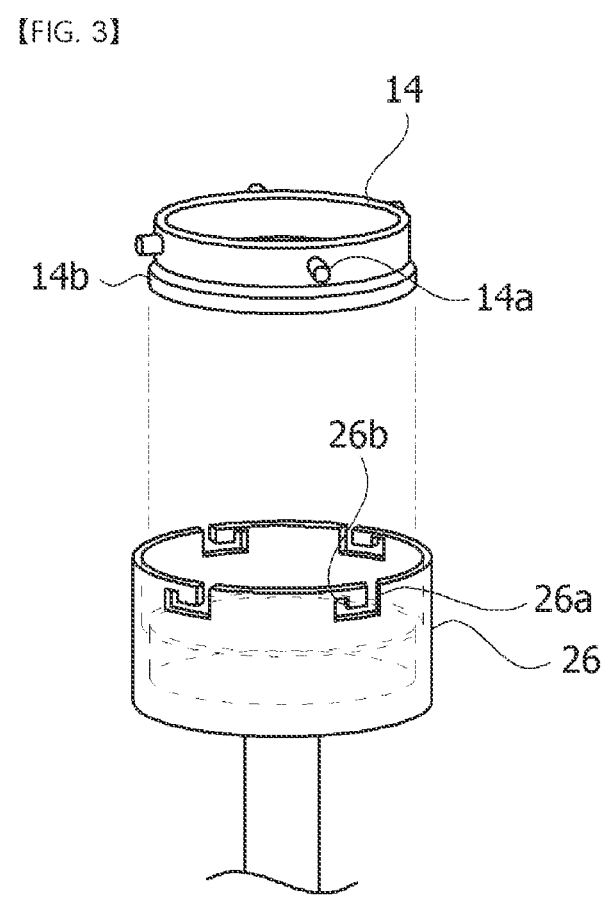

【FIG. 3】

【FIG. 4】
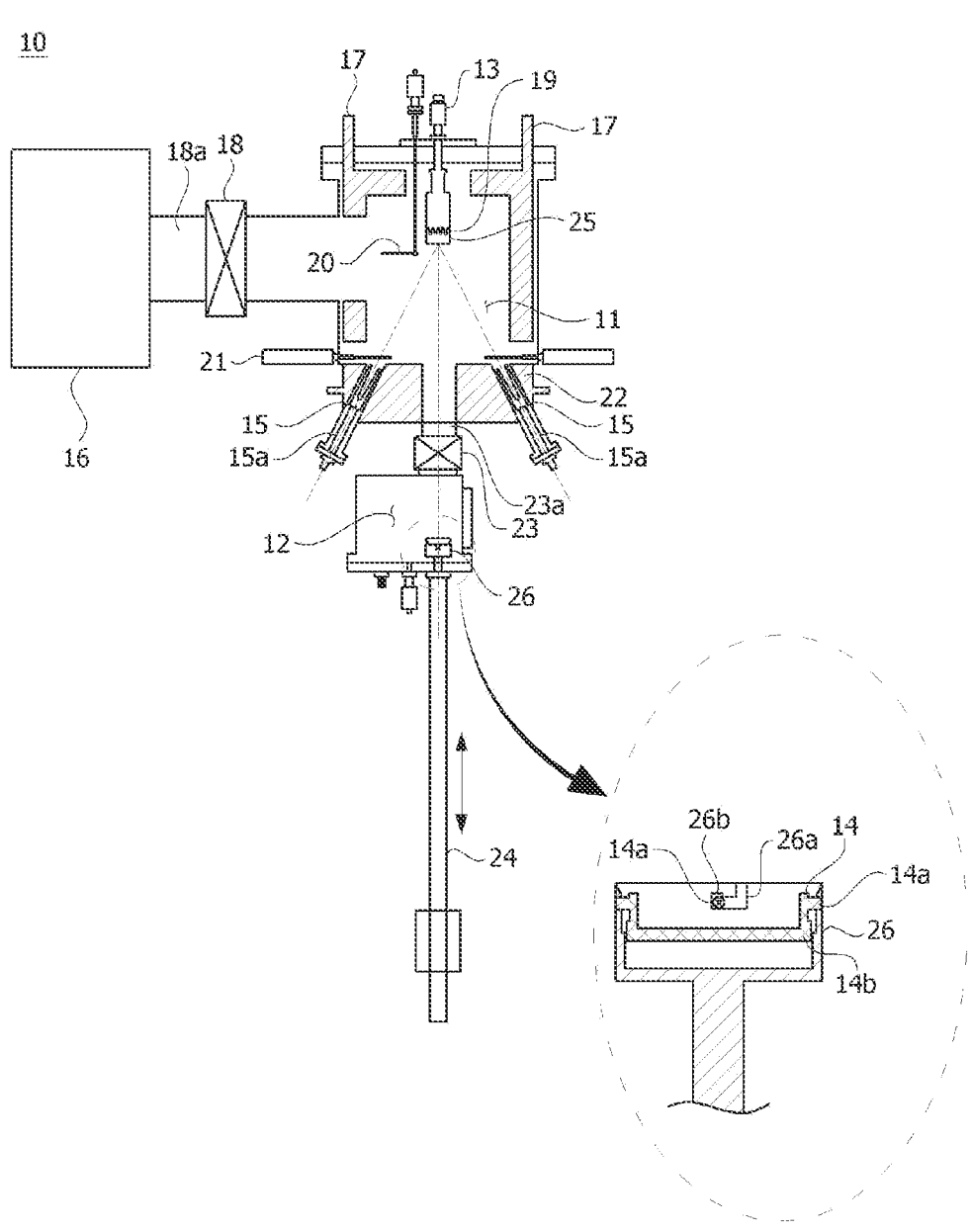

[FIG. 5]
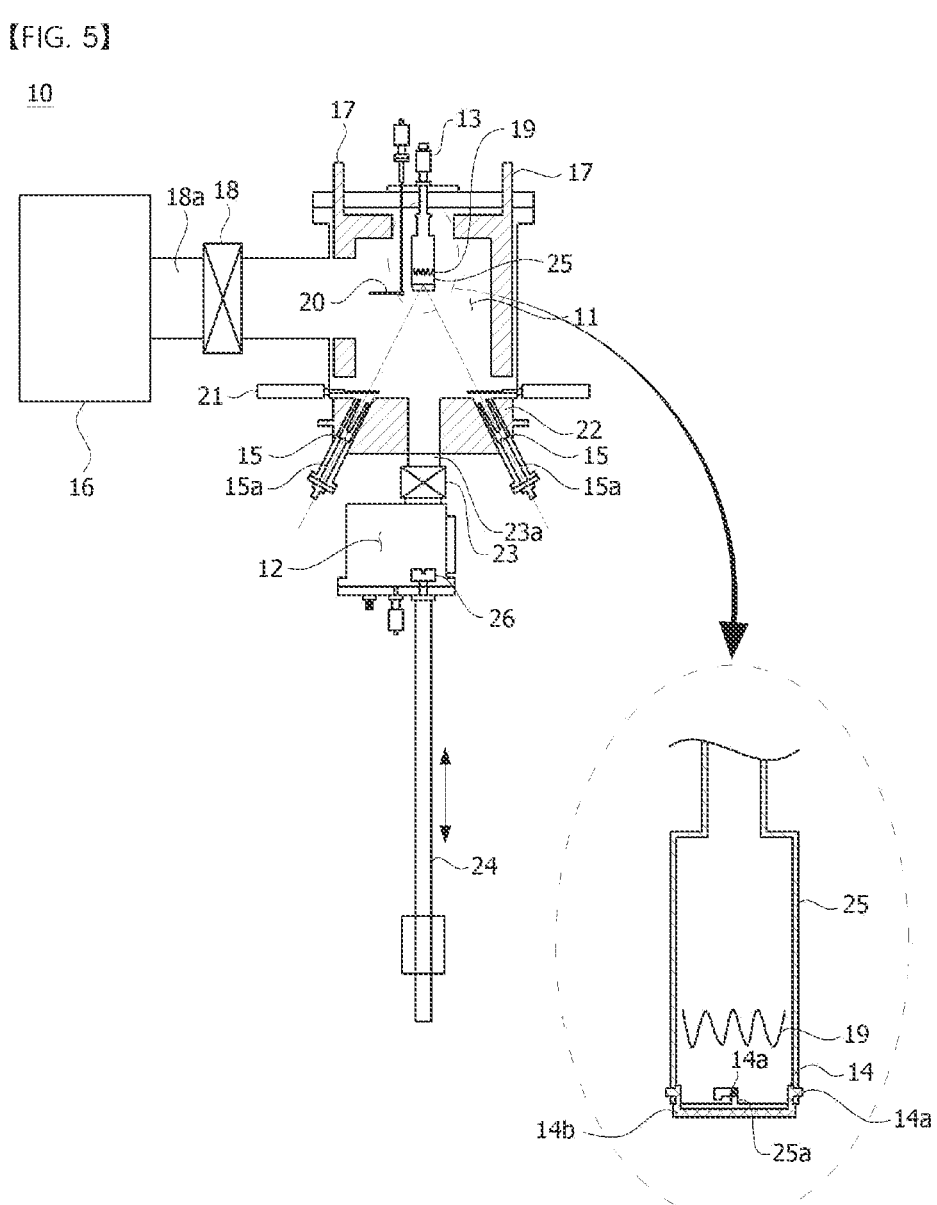

[FIG. 6]
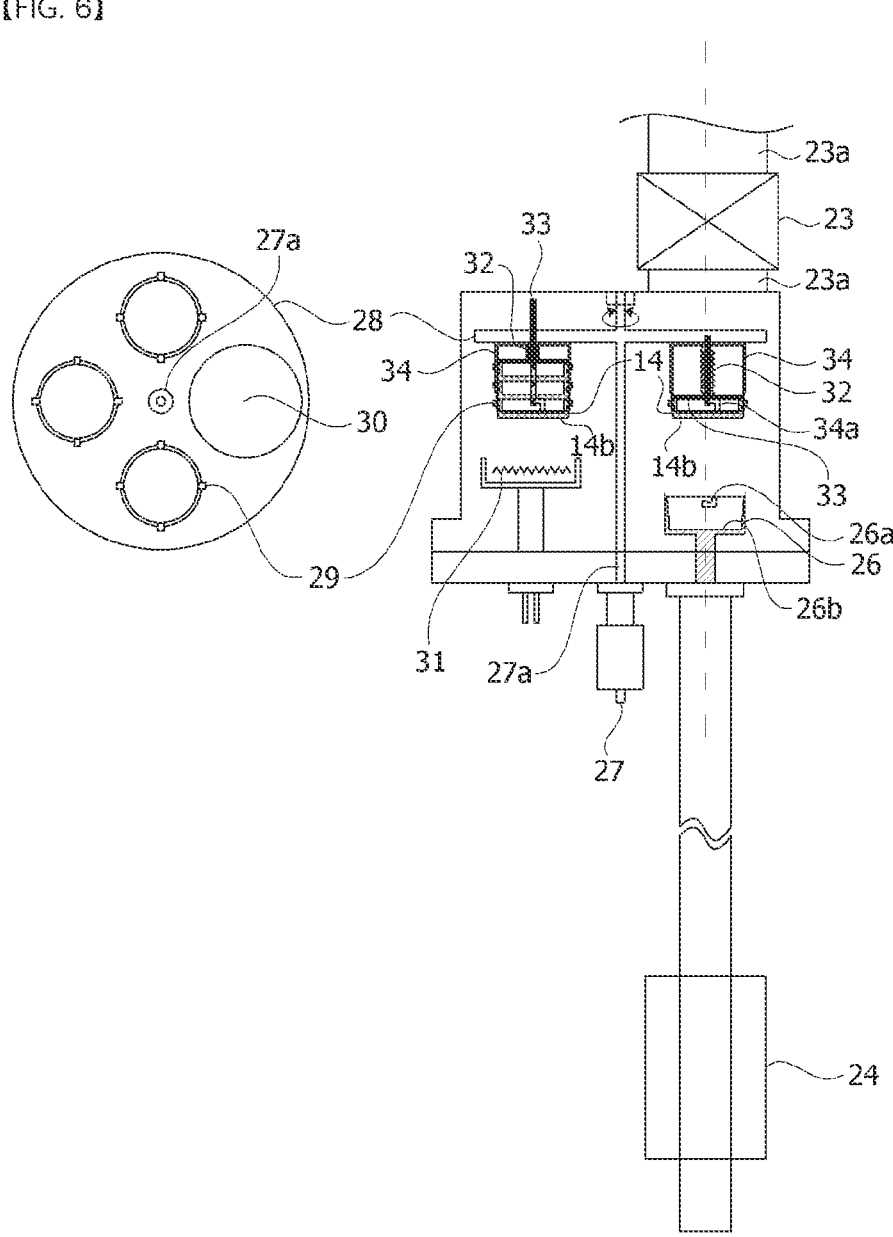

【FIG. 7】
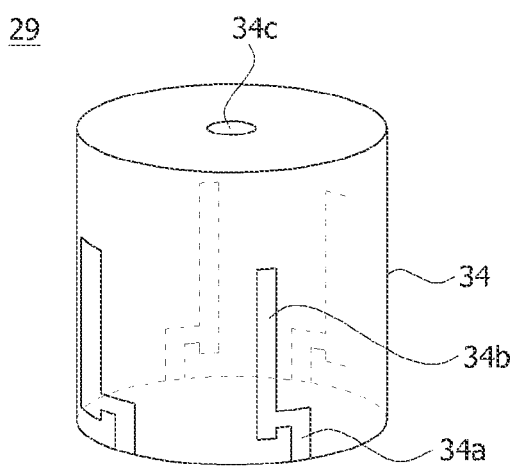
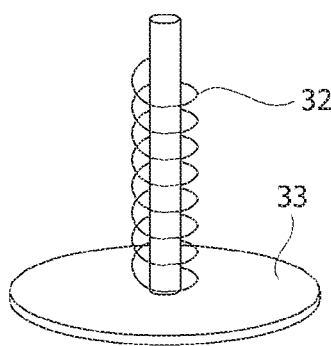
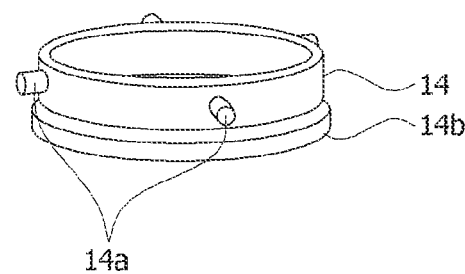

【FIG. 8】
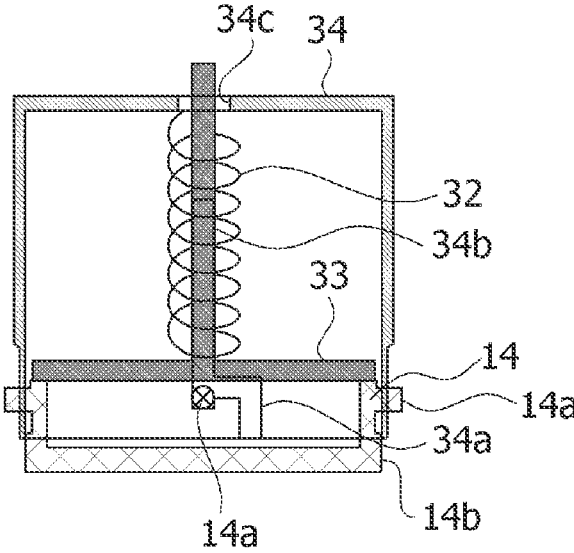
【FIG. 9】
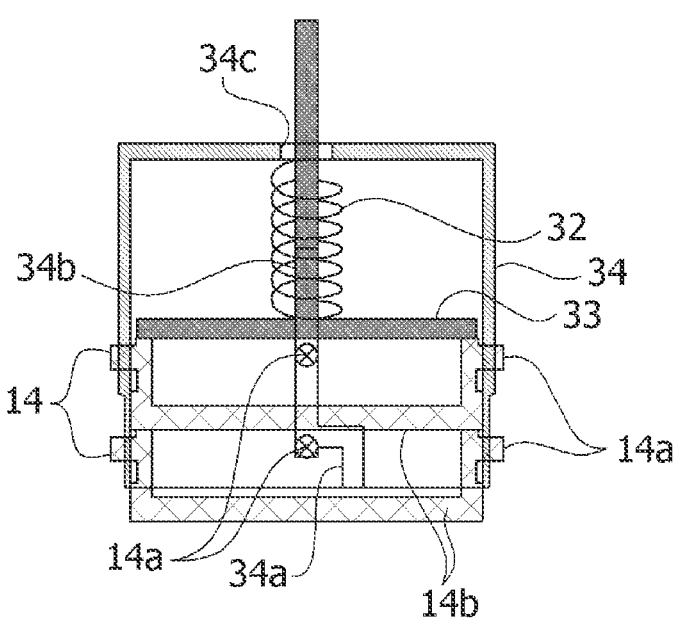

[FIG. 10]
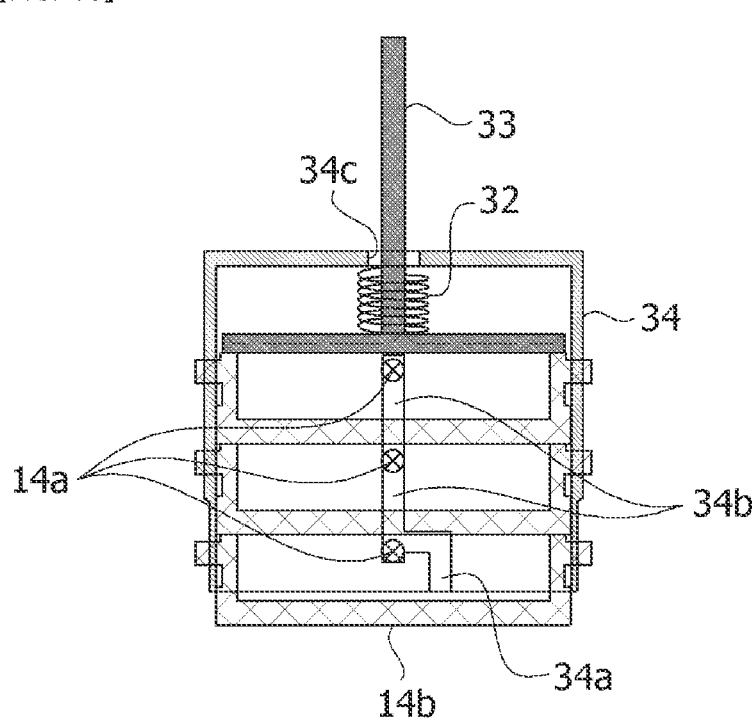

【FIG. 11】
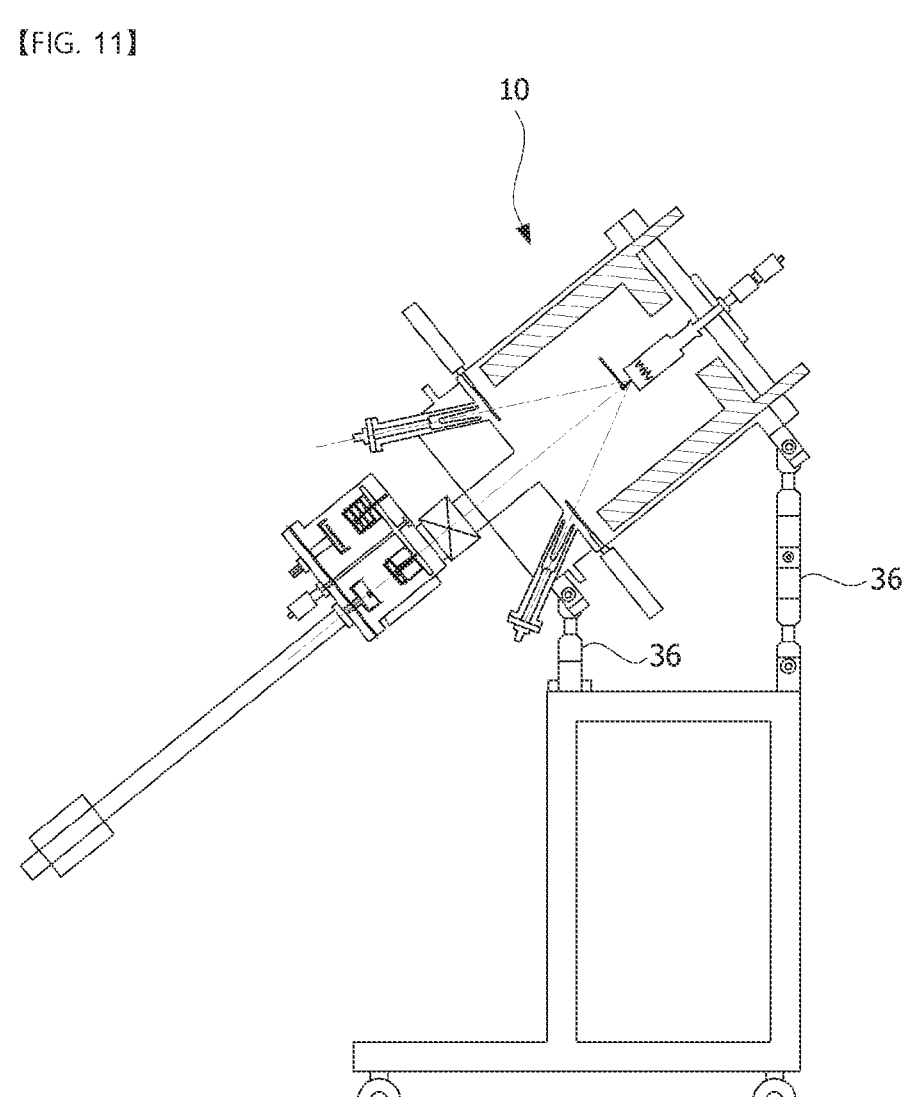

【FIG. 12】
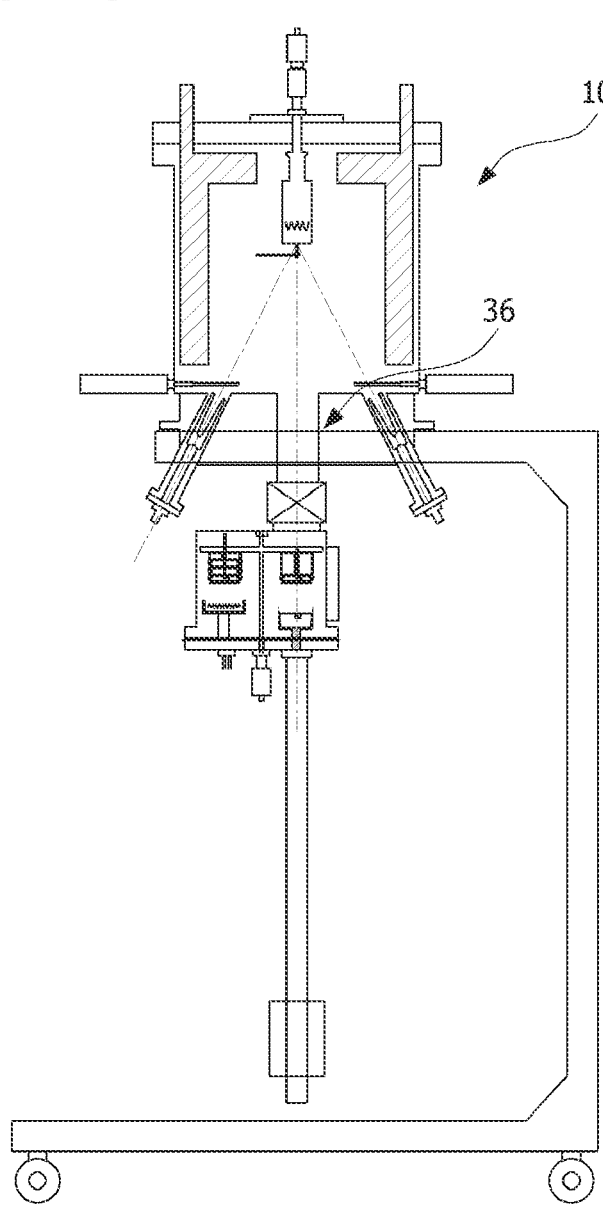

[FIG. 13]
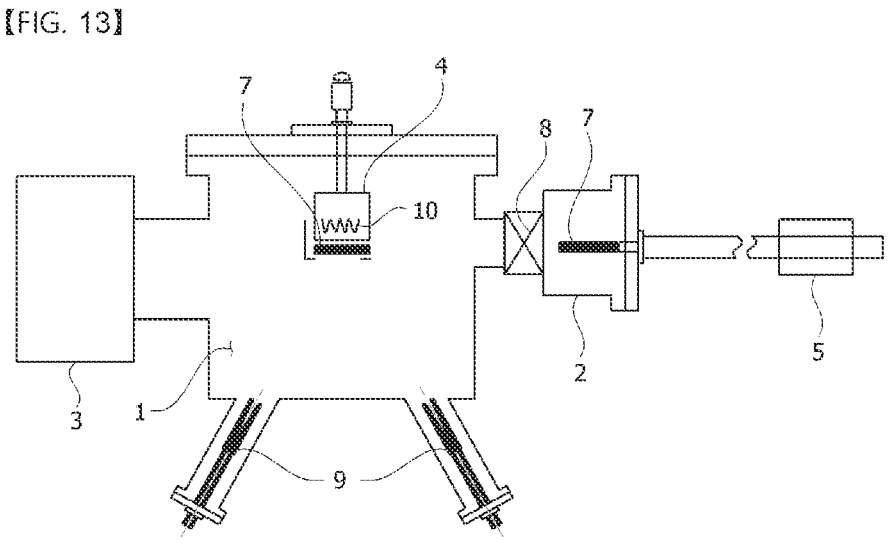

[FIG. 14]
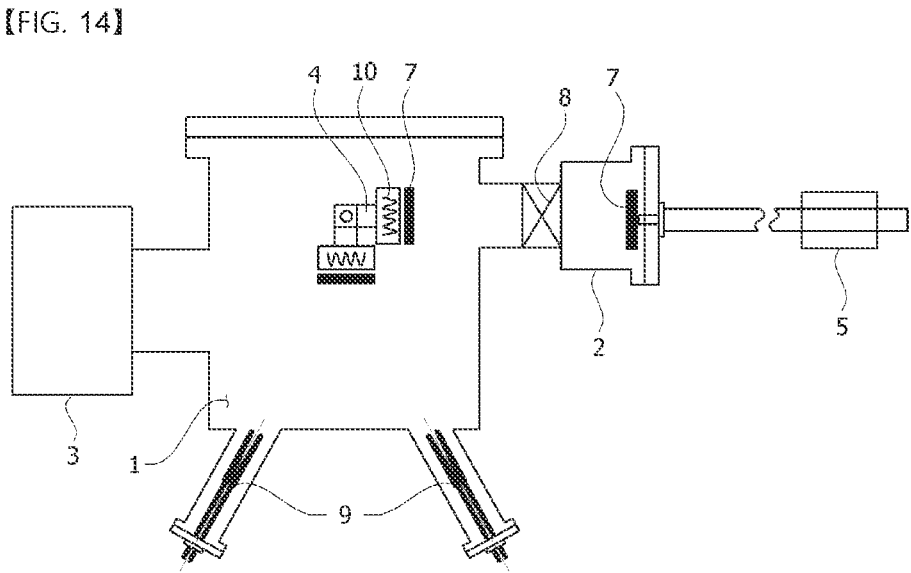

MOLECULAR BEAM EPITAXY THIN FILM GROWTH APPARATUS

TECHNICAL FIELD

The present invention relates to a molecular beam epitaxy thin film growth apparatus, and more particularly, to a molecular beam epitaxy thin film growth apparatus capable of growing a thin film by depositing an evaporation material on a substrate.

BACKGROUND ART

Compound semiconductor materials are spotlighted as next-generation high-frequency and power semiconductors that can replace conventional silicon due to excellent material properties. As a result, R&D related to nitride semiconductors is being actively conducted. However, materials are mainly grown on heterogeneous substrates due to the absence of substrates for development of nitride semiconductors. For reference, sapphire, silicon carbide, silicon, and the like are used for growing nitride semiconductors, and in some cases, in order to improve the performance of the existing silicon semiconductor, an epitaxial layer formed of germanium may be regrown on silicon.

Examples of an epitaxy apparatus include a metal-organic chemical vapor deposition (MOCVD) apparatus, a molecular beam epitaxy (MBE) apparatus, a hybrid vapor phase epitaxy (HYPE) apparatus, and the like. Among them, the MBE apparatus has the advantages of excellent thin film properties, low-temperature growth, and real-time process monitoring, and thus is widely used for epitaxy.

The MBE apparatus is an apparatus that grows a high-quality thin film material on a substrate using a metal flux and plasma in an ultra-high vacuum environment.

FIGS. 13 and 14 are views illustrating a structure of an MBE thin film growth apparatus that is currently commercialized and used.

As illustrated in FIGS. 13 and 14, a general MBE thin film growth apparatus includes a growth chamber 1, a load-lock chamber 2, a preparation chamber (not illustrated), a vacuum pump 3, a substrate manipulator 4, a substrate transfer rod 5, a substrate 7, a gate valve 8, a molecular beam effusion cell 9, and a heater 10.

In the MBE thin film growth apparatus, the substrate 7 cleaned in air is put in the load-lock chamber 2, a vacuum in the range of about $10^{-6}$ Torr to $10^{-8}$ Torr is generated, the gate valve 8 between the load-lock chamber 2 and the growth chamber 1 is then opened, and the substrate 7 is transferred from the load-lock chamber 2 to the substrate manipulator 4 of the growth chamber 1 using the substrate transfer rod 5. The grown thin film substrate 7 is transferred to the load-lock chamber 2 using the substrate transfer rod 5, the gate valve 8 is closed, a gas at 1 atm pressure is injected into the load-lock chamber 2, and the substrate 7 is then out thereof. By repeatedly performing this process, a thin film is grown on the substrate 7.

In general, the MBE thin film growth apparatus is an apparatus with frequent failures. Only when all components of the MBE thin film growth apparatus are operated normally, the growth of the thin film can be performed by the MBE thin film growth apparatus.

Meanwhile, referring to FIG. 13 the MBE thin film growth apparatus is installed so that a surface of the molecular beam effusion cell 9 that evaporates a material and the substrate manipulator 4 face each other. In this case, the substrate manipulator 4 has a rotating function in a substrate surface direction. The substrate 7 is transferred from the load-lock chamber 2 using the substrate transfer rod 5, and the load-lock chamber 2 is located in a direction perpendicular to a line formed by the surface of the molecular beam effusion cell 9 and the substrate manipulator 4. Here, the substrate 7 is horizontally introduced and is inserted into the substrate transfer rod 5 in one of various manners.

Sag occurs due to the weight of the substrate 7 and a substrate holder (not illustrated), the weight of the substrate transfer rod 5, and the like, and thus the MBE thin film growth apparatus having such a structure is difficult to move to an accurate location. Accordingly, there is a disadvantage in that it is difficult to load and unload the substrate 7, and as the number of times of use increases, the loading and unloading of the substrate 7 become more difficult, and thus the substrate 7 is frequently dropped. Occasionally, the substrate holder supporting the dropped substrate 7 blocks the molecular beam effusion cell 9, and accordingly, there is a hassle to open the growth chamber 1.

Further, referring to FIG. 14, the MBE thin film growth apparatus is manufactured so that the substrate manipulator 4 may rotate in two directions. In other words, the substrate manipulator 4 has a substrate axis rotation which rotates the substrate 7 in a surface direction of the substrate 7.

That is, when a sample is received, the substrate manipulator 4 is rotated in a direction of the load-lock chamber 2 to receive the substrate 7, and when the thin film is grown, the substrate manipulator 4 on which the substrate 7 is mounted is rotated in a direction of the molecular beam effusion cell 9.

In the MBE thin film growth apparatus having such a structure, the heater 10 and a thermocouple wire (not illustrated) below the substrate 7 should always move together. Accordingly, as an insulating part of the heater 10 or the thermocouple wire is peeled off, a short circuit between heater 10 or the thermocouple wire and the growth chamber 1 or a short circuit between the heater 10 and the thermocouple wire occurs, thereby resulting in a malfunction. Further, the temperature of the substrate 7 is changed due to the short circuit of the heater 10, thereby causing problems in properties and reproducibility of the thin film. Accordingly, there is a hassle to frequently clean the substrate manipulator 4.

As described above, the causes of failures of the MBE thin film growth apparatus are various but may be roughly classified into a structural factor of the apparatus, a factor due to the carelessness of a user, and a maintainability factor.

For example, structural failure factors may include a case in which, when the substrate 7 is transferred or attached/detached inside the growth chamber 1, the substrate 7 is dropped inside the growth chamber 1 and thus blocks the molecular beam effusion cell 9 and a case in which the heater 10 and the substrate manipulator 4 fail due to a temperature measurement error.

Further, failure factors due to the carelessness of a user may include a case in which a thin film is grown in a state in which a viewport or a reflection high-energy electron diffraction (RHEED) shutter is open, the viewport is coated with the thin film, and thus the interior cannot be viewed, a case in which the thin film is applied on a fluorescent material in the RHEED or the viewport, and thus RHEED interference fringes are not visible, a case in which a crucible (not illustrated) of the molecular beam effusion cell 9 is broken, materials flow downward, and thus the molecular beam effusion cell 9 is damaged, and a case in which many materials are applied due to use of a high vapor pressure material, and thus the vacuum pump 3 and a vacuum gauge (not illustrated) are not normally operated.

Further, maintainability failure factors may include a case in which air is not blocked as foreign matter is caught in the gate valve 8 due to long-term use, a case in which a filament of a titanium sublimation pump (not illustrated) is exhausted, a case in which a quartz sensor of a quartz thickness monitor (not illustrated) is coated over a limit and thus needs to be replaced, and a case in which a solenoid valve (not illustrated) that adjust a pneumatic pressure of the gate valve 8 or a pneumatic shutter (not illustrated) is broken.

The above-described failure factors due to the careless-ness of the user may be solved when skill of the user is increased in using the MBE thin film growth apparatus, and the maintenance failure factors may also be solved by cleaning the MBE thin film growth apparatus in consider-ation of the lifetimes of components of the MBE thin film growth apparatus when the growth chamber 1 is opened or periodically replacing the filament of the titanium sublima-tion pump.

However, the structural failure factors are not solved by increasing the skill of the user, replacing the components, or cleaning the apparatus.

Accordingly, there is a need to develop an MBE thin film growth apparatus in which structural failure factors may not occur and which has a structure different from the structure of the MBE thin film growth apparatus according to the related art.

DISCLOSURE

Technical Problem

The present invention is directed to providing a molecular beam epitaxy (MBE) thin film growth apparatus which is capable of preventing a substrate from being dropped when a substrate is moved from a load-lock chamber to a growth chamber or moved from the growth chamber to the load-lock chamber and reducing the cause of a failure due to a short circuit of a heater or thermocouple for heating the substrate.

The aspects of the present invention are not limited to the aspects described above, and those skilled in the art will dearly understand other aspects not described from the following description.

Technical Solution

One aspect of the present invention provides a molecular beam epitaxy (MBE) thin film growth apparatus including a growth chamber which is connected to a vacuum pump and of which an inside is maintained in an ultra-high vacuum state, a substrate manipulator which is provided inside the growth chamber and on which a substrate is mounted, a load-lock chamber which is provided outside the growth chamber and communicates with the growth chamber and in which at least one substrate, which is mounted on the substrate manipulator, for growing a thin film is located, and a substrate transfer rod that transfers the substrate from the load-lock chamber to the growth chamber or from the growth chamber to the load-lock chamber, wherein the load-lock chamber is disposed to face the substrate manipu-lator and disposed collinear with a substrate transfer path of the substrate transfer rod.

The growth chamber may further include an evaporation source mounting port on which at least one molecular beam effusion cell that generates an evaporation material for growing the thin film on the substrate mounted on the substrate manipulator is mounted therein, the evaporation source mounting port and the load-lock chamber may be formed coplanar with the growth chamber, and the evapo-ration source mounting port may be disposed obliquely with respect to the substrate transfer path of the substrate transfer rod.

A connection passage connecting the load-lock chamber and the growth chamber may be opened or closed by a gate valve, when the thin film is grown on the substrate, the connection passage may be opened, and the substrate may be mounted on the substrate manipulator by being moved from the load-lock chamber to the growth chamber through the connection passage opened by the substrate transfer rod, while the thin film is grown on the substrate, in a state in which the substrate transfer rod is out of the growth cham-ber, the connection passage may be closed, and when the thin film is completely grown on the substrate, the connec-tion passage may be opened again, and the substrate may be separated from the substrate manipulator through the con-nection passage opened by the substrate transfer rod and may be moved from the growth chamber to the load-lock chamber.

The substrate may be fixed to a substrate holder, the substrate holder may be provided with at least one coupling protrusion so that the substrate holder is coupled to the substrate manipulator and the substrate transfer rod, and the substrate transfer rod and the substrate manipulator may be formed with at least one coupling groove provided in a shape corresponding to the coupling protrusion so that the cou-pling protrusion is fixedly inserted into the coupling groove.

A substrate connection part that facilitates coupling with the substrate holder may be couped to the substrate transfer rod, and the substrate connection part may be formed with at least one coupling groove corresponding to the coupling protrusion of the substrate holder.

When the thin film is grown on the substrate, the substrate holder may be moved from the load-lock chamber to the growth chamber by the substrate transfer rod in a state in which the coupling protrusion of the substrate holder is coupled to the coupling groove of the substrate connection part, the coupling protrusion may be uncoupled from the coupling groove of the substrate connection part and may be coupled to the coupling groove of the substrate manipulator, and thus the substrate holder may be located inside the growth chamber, and when the thin film is completely grown on the substrate, the substrate holder may be moved from the growth chamber to the load-lock chamber by the substrate transfer rod in a state in which the coupling protrusion of the substrate holder is uncoupled from the coupling groove of the substrate manipulator and is coupled to the coupling groove of the substrate connection part again.

The coupling groove may be formed with a bent part bent in one side to prevent the fixedly inserted coupling protru-sion from being separated.

The load-lock chamber may further include a substrate storage part in which at least one substrate that is moved to the growth chamber to grow the thin film is stored.

The substrate storage part may include a rotation member that is fixed to a center of the load-lock chamber and rotated in one direction or the other direction, and a plurality of storage units which are installed in the rotation member and in which a plurality of substrates are stored, the rotation member may be provided with a substrate movement part formed to pass through a portion at a location in which the storage unit is not installed, and when the substrate is to be moved from the load-lock chamber to the growth chamber or moved from the growth chamber to the load-lock chamber, the rotation member may be rotated so that a substrate movement path of the substrate transfer rod and the substrate movement part are collinear with each other.

Rotation centers of the substrate transfer path of the substrate transfer rod and the rotation member may be different from each other.

The storage unit may include a casing of which at least one end is formed as an open surface, in which the substrate is located, and which has at least one support groove in which the coupling protrusion of the substrate holder is fitted, a support member which is located inside the casing and on which the substrate located in the casing is placed, and an elastic body which is located between the casing and the support member in a state of being fitted in the support member and elastically supports the plurality of substrate holders placed on the support member.

The load-lock chamber may be provided with a heater for outgassing the substrate stored in the load-lock chamber.

The growth chamber may be provided with a shutter for blocking foreign matter from adhering to the substrate mounted on the substrate manipulator, and the shutter may be installed in a location near the substrate manipulator and may be installed to be rotatable toward the substrate manipulator.

The substrate manipulator may be provided with a heating member installed to be rotatable with respect to the growth chamber in one direction or the other direction and configured to heat the mounted substrate.

The molecular beam effusion cell installed in an evaporation source port may be disposed so that the evaporation material emitted from the molecular bean evaporation source faces the substrate manipulator, and the growth chamber may be provided with an adjustment member for adjusting an amount of the evaporation material emitted toward the substrate manipulator.

The growth chamber may be provided with a cooling member for decreasing a temperature of an inside of the growth chamber when the thin film is grown on the substrate.

The MBE thin film growth apparatus may further include at least one chamber support provided to adjust an inclination of the MBE thin film growth apparatus with respect to one surface on which the MBE thin film growth apparatus is installed.

Advantageous Effects

A molecular beam epitaxy (MBE) thin film growth apparatus of the present invention has an advantage in that, since a load-lock chamber and a substrate manipulator are arranged to face each other and are arranged collinear with a substrate transfer path of a substrate transfer rod that transfers a substrate from the load-lock chamber to a growth chamber or from the growth chamber to the load-lock chamber, a possibility that the substrate is dropped while the substrate is transferred is greatly reduced, and thus the thin film growth apparatus can be used for a long time.

Further, in the MBE thin film growth apparatus according to the present invention, the cause of a failure due to a short circuit of a heater and a thermocouple mounted on the substrate manipulator is prevented, and thus the reliability of a thin film growth process can be improved.

Further, in the MBE thin film growth apparatus according to the present invention, as a substrate storage part is provided inside the load-lock chamber, a plurality of substrates for growing a thin film can be stored, and outgassing can be performed by heating the stored load-lock chamber as needed.

The effects of the present invention are not limited to those described above, and other effects not described will be clearly understood by those skilled in the art to which the present invention pertains from the following description.

DESCRIPTION OF DRAWINGS

FIG. 1 is a view illustrating a molecular beam epitaxy (MBE) thin film growth apparatus according to an embodiment of the present invention.

FIG. 2 is a view for describing a connection state of a substrate manipulator and a substrate holder illustrated in FIG. 1.

FIG. 3 is a view for describing a connection state of the substrate holder and a substrate transfer rod illustrated in FIG. 1.

FIG. 4 is a view illustrating a state in which a substrate connection part and the substrate holder are coupled to the substrate transfer rod illustrated in FIG. 1.

FIG. 5 is a view illustrating a state in which the substrate holder is coupled to the substrate manipulator illustrated in FIG. 1, FIG. 6 is a view for describing a load-lock chamber illustrated in FIG. 1.

FIG. 7 is a view for describing a storage unit illustrated in FIG. 5.

FIGS. 8 to 10 are views for describing a method in which the substrate holder is stored in the storage unit illustrated in FIG. 6.

FIGS. 11 and 12 are views for describing an installation state of the MBE thin film growth apparatus illustrated in FIG. 1.

FIGS. 13 and 14 are views illustrating an example of an MBE thin film growth apparatus according to a related art.

MODES OF THE INVENTION

Hereinafter, embodiments of the present invention will be described in detail with reference to the accompanying drawings so that those skilled in the art to which the present invention pertains may easily implement the present invention. The present invention may be implemented in various different forms and is not limited to the embodiments described herein.

It is noted that the drawings are schematic and not illustrated in accordance with a scale, Relative dimensions and ratios of parts in the drawings are illustrated in an exaggerated or reduced manner in size for clarity and convenience in the drawings, and predetermined dimensions are merely illustrative and not limitative. Further, the same reference numeral is used as the same structure, the same element, or the same component illustrated in two or more drawings, to indicate similar features.

The embodiments of the present invention specifically represent ideal embodiments of the present invention. As a result, various modifications of the drawing are expected. Thus, the embodiments are not limited to specific shapes and include, for example, modifications of shapes by manufacturing.

Hereinafter, a molecular beam epitaxy (MBE) thin film growth apparatus 10 (hereinafter, referred to as a "thin film growth apparatus") according to an embodiment of the present invention will be described with reference to the accompanying drawings.

As illustrated in FIGS. 1, 4, and 5, the thin film growth apparatus 10 according to the embodiment of the present invention includes a growth chamber 11 that maintains an ultra-high vacuum state, a substrate manipulator 25 which is provided inside the growth chamber 11 and on which a substrate holder 14 is mounted, a load-lock chamber 12 which is provided inside the growth chamber 11 and in which a substrate 14b is located, and a substrate transfer rod 24 that transfers the substrate 14b from the load-lock chamber 12 to the growth chamber 11 or from the growth chamber 11 to the load-lock chamber 12.

Referring to FIG. 1, the growth chamber 11 is formed in a shape surrounded by an outer wall and has a hollow therein. Except for the load-lock chamber 12, most components for growing a thin film on the substrate 14b are arranged inside the growth chamber 11.

The growth chamber 11 is connected to a vacuum pump 16. Accordingly, the inside of the growth chamber 11 is formed and maintained in an ultra-high vacuum state.

In this case, the vacuum pump 16 connected to the growth chamber 11 may be provided as a roughing pump, a turbomolecular pump, an ion pump, a cryo pump, a titanium sublimation pump or the like, but the present invention is not limited thereto.

The growth chamber 11 and the vacuum pump 16 are connected to each other through a connection passage 18a, and the connection passage 18a is opened or closed by a gate valve 18.

Meanwhile, the substrate manipulator 25 is provided inside the growth chamber 11.

The substrate manipulator 25 is a part on which the substrate 14b for growing the thin film is mounted and is provided inside the growth chamber 11.

In this case, the substrate manipulator 25 is provided inside the growth chamber 11 to be rotatable in one direction or the other direction. In other words, the substrate manipulator 25 is fixed to an upper side of the growth chamber 11 through a substrate mounting driving part 13 and disposed to be rotatable in the one direction or the other direction. Accordingly, when the thin film is grown on the substrate 14b, the thin film may be more effectively grown on the substrate 14b.

A space in which the substrate holder 14 is mounted is formed in a lower end portion of the substrate manipulator 25. In this case, the shape of the substrate manipulator 25 may be modified into a cylindrical shape, a quadrangular shape, or the like according to the shape of the substrate holder 14.

Here, referring to FIG. 2, at least one coupling groove 25a is provided in the substrate manipulator 25. The coupling groove 25a is a part for facilitating the mounting of the substrate holder 14 on the substrate manipulator 25, In this case, at least one coupling protrusion 14a is formed in the substrate holder 14, and the coupling groove 25a is formed in the form of one kind of groove to correspond to the coupling protrusion 14a of the substrate holder 14.

Accordingly, the coupling protrusion 14a of the substrate holder 14 is fixedly inserted into the coupling groove 25a of the substrate manipulator 25, and thus the substrate holder 14 may be stably positioned with respect to the substrate manipulator 25.

Meanwhile, the substrate 14b is used in a state of being coupled to the substrate holder 14. In other words, in a state in which the substrate 14b is attached to a lower end of the substrate holder 14, the substrate holder 14 is mounted on the substrate manipulator 25. That is, the substrate 14b is also mounted at the time when the substrate holder 14 is mounted on the substrate manipulator 25.

The coupling groove 25a of the substrate manipulator 25 has a shape bent to one side. In other words, a bent part 25b bent to one side is formed in order to prevent the coupling protrusion 14a of the substrate holder 14 fixedly inserted into the coupling groove 25a of the substrate manipulator 25 from being separated from the substrate manipulator 25.

Since the bent part 25b is formed in the coupling groove 25a of the substrate manipulator 25, the coupling protrusion 14a of the substrate holder 14 is prevented from being separated from the coupling groove 25a when being inserted into the coupling groove 25a of the substrate manipulator 25. At the same time, the substrate holder 14 to which the substrate 14b is attached may be more stably positioned in the substrate manipulator 25.

Further, the substrate manipulator 25 is provided with a heating member 19. The heating member 19 is a member for heating the substrate holder 14 mounted on the substrate manipulator 25 to a high temperature. For reference, the heating member 19 may be provided as one kind of heater, but the present invention is not limited thereto.

Meanwhile, an evaporation source mounting port 15 is formed in the growth chamber 11, and a molecular beam effusion cell 15a is mounted on the evaporation source mounting port 15.

The molecular beam effusion cell 15a is a member that generates an evaporation material for growing the thin film on the substrate 14b mounted on the substrate manipulator 25.

The evaporation material emitted from the molecular beam effusion cell 15a is emitted toward the substrate 14b mounted on the substrate manipulator 25. For reference, the emitted evaporation material may be changed depending on a material heated inside the molecular beam effusion cell 15a.

Here, the growth chamber 11 is provided with a shutter 20. The shutter 20 is a member for blocking foreign matter from being attached to the substrate 14b mounted on the substrate manipulator 25.

The shutter 20 is installed to be rotatable toward the substrate manipulator 25 and protects a surface of the substrate 14b.

When the molecular beam effusion cell 15a is heated, materials or foreign matter in the vicinity of the molecular beam effusion cell 15a may be attached to the substrate 14b mounted on the substrate manipulator 25 in a clean state. In this case, even when the thin film is grown on the substrate 14b, defects occur or the thin film is not grown properly.

In order to prevent this problem, as the shutter 20 is provided to be adjacent to the substrate manipulator 25, the surface of the substrate 14b is protected so that foreign matter is not attached to the substrate 14b mounted on the substrate manipulator 25.

For reference, the shutter 20 may be provided to be openable or closeable from the outside. This is for starting coating the substrate 14b from the outside.

Further, the growth chamber 11 may be provided with a height adjustment member (not illustrated) such as a wobble (not illustrated) to adjust a height of the surface of the substrate 14b mounted on the substrate manipulator 25.

As described above, the molecular beam effusion cell 15a generates and emits the evaporation material for growing the thin film on the substrate 14b. In this case, the molecular beam effusion cell 15a is disposed so that the emitted evaporation material faces the substrate manipulator 25 and the substrate 14b mounted on the substrate manipulator 25.

It is preferable that the amount of the evaporation material emitted from the molecular beam effusion cell 15*a* is adjusted depending on a state of the substrate 14*b* or the like.

To this end, the growth chamber 11 is provided with an adjustment member 21.

The adjustment member 21 is provided at a location near the evaporation source mounting port 15, that is, at a tip side of the evaporation source mounting port 15, so as to adjust the amount of the evaporation material emitted from the molecular beam effusion cell 15*a* toward the substrate manipulator 25 and the substrate 14*b*.

The adjustment member 21 as a kind of shutter adjusts the amount of the evaporation material for growing the thin film on the substrate 14*b* by blocking the amount of the evaporation material emitted from the molecular beam effusion cell 15*a* while moving leftward or rightward through a linear motion.

Meanwhile, although not illustrated in the drawings, the adjustment member 21 may be not provided on the tip side of the growth chamber 11 and the evaporation source mounting port 15 but may be provided directly on the molecular beam effusion cell 15*a* itself. For example, the adjustment member 21 provided in the molecular beam effusion cell 15*a* may be provided in a rotational form to adjust the amount of the evaporation material emitted from the molecular beam effusion cell 15*a*.

In this way, when the evaporation material is emitted from the molecular beam effusion cell 15*a* toward the substrate 14*b* mounted on the substrate manipulator 25, a lot of heat is generated by the molecular beam effusion cell 15*a*, a temperature of the growth chamber 11 is increased due to the generated heat, and thus the degree of vacuum of the growth chamber 11 is reduced.

In order to solve this problem, a cooling member 22 is provided in the growth chamber 11, that is, around the evaporation source mounting port 15 provided in the growth chamber 11.

The cooling member 22 provided in the growth chamber 11 around the evaporation source mounting port 15 is provided as a cooling jacket using one of various refrigerants including liquid nitrogen or cooling water. The growth chamber 11 around the evaporation source mounting port 15 is cooled by the cooling member 22 using the refrigerant.

Meanwhile, a cooling member 17 is also provided inside the growth chamber 11. While the thin film is grown on the substrate 14*b*, a part of the evaporation material emitted from the molecular beam effusion cell 15*a* is emitted not toward the substrate 14*b* but toward an inner wall of the growth chamber 11. Accordingly, as the evaporation material hits the inner wall of the growth chamber 11 and bounces off from the inner wall, the evaporation material becomes an impurity, and thus purity of the thin film grown on the substrate 14*b* may be reduced.

In this case, when the liquid nitrogen flows in the cooling member 17 provided inside the growth chamber 11, the inner wall of the growth chamber 11 enters a cold state. Accordingly, even when the evaporation material emitted from the molecular beam effusion cell 15*a* is emitted toward the inner wall of the growth chamber 11, the evaporation material is stuck to the cold cooling member 17, and thus the purity of the thin film grown on the substrate 14*b* is not affected.

Moreover, since the inner wall of the growth chamber 11 is cooled by the cooling member 17, the inside of the growth chamber 11 may more advantageously maintain an ultrahigh vacuum state.

A refrigerant using a chiller other than the liquid nitrogen may be used in the cooling member 17 provided inside the growth chamber 11.

The load-lock chamber 12 is a part in which the substrate 14*b* for growing the thin film is moved to or from the outside and is stored.

The load-lock chamber 12 is provided outside the growth chamber 11 and communicates with the growth chamber 11. In this case, the load-lock chamber 12 and the growth chamber 11 is connected through a connection passage 23*a*, and the connection passage 23*a* is opened or closed by a gate valve 23.

When the thin film is grown on the substrate 14*b*, the gate valve 23 is opened to open the connection passage 23*a*, while the thin film is grown on the substrate 14*b*, the gate valve 23 is closed, and when the thin film is completely grown on the substrate 14*b*, the gate valve 23 is opened again.

Accordingly, when the thin film is grown on the substrate 14*b*, the connection passage 23*a* is opened, and the substrate 14*b* is moved from the load-lock chamber 12 to the growth chamber 11 through the connection passage 23*a* opened by the substrate transfer rod 24 and is mounted on the substrate manipulator 25.

When the thin film is completely grown on the substrate 14*b*, the connection passage 23*a* is opened again, and the substrate 14*b* is separated from the substrate manipulator 25 through the connection passage 23*a* opened by the substrate transfer rod 24 and is transferred from the growth chamber 11 to the load-lock chamber 12. After the thin film is completely grown, the substrate 14*b* transferred to the load-lock chamber 12 is moved to the outside air.

For reference, while the thin film is grown on the substrate 14*b*, in a state in which the substrate transfer rod 24 is out of the growth chamber 11, the connection passage 23*a* is closed.

The substrate 14*b* located inside the load-lock chamber 12 is transferred into the growth chamber 11 through the connection passage 23*a* and is mounted on the substrate manipulator 25.

The substrate 14*b* is transferred from the load-lock chamber 12 to the growth chamber 11 by the substrate transfer rod 24 or is transferred from the growth chamber 11 to the load-lock chamber 12 after the thin film is completely grown.

A substrate connection part 26 is coupled to the substrate transfer rod 24. The substrate connection part 26 is a member coupled to the substrate holder 14 located in the load-lock chamber 12 and the growth chamber 11 to facilitate transfer of the substrate holder 14 to the load-lock chamber 12 or the growth chamber 11.

In this case, referring to FIG. 3, at least one coupling groove 26*a* is formed in the substrate connection part 26. The coupling groove 26*a* of the substrate connection part 26 is a configuration for facilitating mounting of the substrate holder 14 on the substrate connection part 26. The coupling groove 26*a* is formed in the form of one kind of groove corresponding to the coupling protrusion 14*a* of the substrate holder 14.

Here, the coupling groove 26*a* of the substrate connection part 26 has a shape bent to one side. In other words, a bent part 26*b* bent to one side is formed in order to prevent the separation of the coupling protrusion 14*a* of the substrate holder 14 fixedly inserted into the coupling groove 26*a* of the substrate connection part 26.

Meanwhile, the load-lock chamber 12 and the substrate manipulator 25 are arranged to face each other and are arranged collinear with a substrate transfer path of the substrate transfer rod 24. In other words, the load-lock chamber 12 and the substrate manipulator 25 are located collinear with the substrate transfer path of the substrate transfer rod 24.

Accordingly, as illustrated in FIG. 4, when the thin film is grown, in a state in which the coupling protrusion 14*a* of the substrate holder 14 is coupled to the coupling groove 26*a* of the substrate connection part 26, the substrate holder 14 is moved from the load-lock chamber 12 to the growth chamber 11 by the substrate transfer rod 24. In this case, the substrate holder 14 is uncoupled from the coupling groove 26*a* of the substrate connection part 26, is coupled to the coupling groove 25*a* of the substrate manipulator 25, and is located inside the growth chamber 11.

In contrast, as illustrated in FIG. 5, when the thin film is completely grown on the substrate 14*b*, the substrate holder 14 is moved from the growth chamber 11 to the load-lock chamber 12 by the substrate transfer rod 24 in a state in which the coupling protrusion 14*a* of the substrate holder 14 is uncoupled from the coupling groove 25*a* of the substrate manipulator 25 and is coupled to the coupling groove 26*a* of the substrate connection part 26 again.

Meanwhile, a process that consumes the most time in the thin film growth apparatus 10 is a process of exposing the load-lock chamber 12 to the air, inserting the substrate 14*b*, and then making a vacuum level of $10^{-6}$ Torr. Accordingly, in the thin film growth apparatus 10, when several substrates 14*b* are prepared at once, a time required for growing the thin film on the substrate 14*b* can be greatly reduced.

As illustrated in FIGS. 6 to 10, the load-lock chamber 12 according to the embodiment of the present invention further includes a substrate storage part in which a plurality of substrates 14*b* are stored.

The substrate storage part is provided inside the load-lock chamber 12 and provided with at least one substrate 4*b*, preferably, a plurality of substrates 14*b*, which are moved to the growth chamber 11 through the substrate transfer rod 24.

The substrate storage part includes a rotation member 28 and a storage unit 29.

The rotation member 28 is fixed to a rotary shaft 27*a* of a rotation driving part 27 installed in a center of the load-lock chamber 12 to be rotatable in one direction or the other direction.

The rotation member 28 is provided as a circular plate having a certain thickness.

For reference, a rotational center of the rotation member 28 is provided at a location different from the substrate transfer path of the substrate transfer rod 24, In other words, the rotational center of the rotation member 28 is located in an outer part in a state of deviating from the substrate transfer path of the substrate transfer rod 24.

The storage unit 29 is a part in which the plurality of substrates 14*b* are stored and is fixedly inserted into the rotation member 28.

The storage unit 29 is provided with a hollow space so that the plurality of substrates 14*b* may be stored therein.

Meanwhile, the rotation member 28 is provided with a substrate movement part 30 formed to pass through a portion at a location in which the storage unit 29 is not installed.

The substrate movement part 30 means an empty space and is a part through which the substrate 14*b* is moved from the load-lock chamber 12 to the growth chamber 11 or from the growth chamber 11 to the load-lock chamber 12.

When the substrate 14*b* stored in the substrate storage part of the load-lock chamber 12 is to be moved from the load-lock chamber 12 to the growth chamber 11 or transferred from the growth chamber 11 to the load-lock chamber 12, it is necessary to arrange a substrate movement path of the substrate transfer rod 24 and a center of the substrate movement part 30 to form a linear line.

To this end, the rotation member 28 rotates using the rotation driving part 27 so that the substrate movement part 30 and the substrate transfer rod 24 are located collinear with each other.

Meanwhile, the storage unit 29 includes a casing 34, a support member 33, and an elastic body 32.

The casing 34 of the storage unit 29 has at least one end, that is, a lower end, which is formed as an open surface, and the substrate holder 14 is located inside the casing 34.

To this end, the casing 34 is provided with at least one support groove 34*a* in which the coupling protrusion 14*a* of the substrate holder 14 is fitted. The support groove 34*a* is provided as a groove having a shape corresponding to the coupling protrusion 14*a* of the substrate holder 14. For reference, the support groove 34*a* may be provided with a bent part 34*b* bent in one direction to prevent the coupling protrusion 14*a* of the substrate holder 14 fitted in the support groove 34*a* from being easily separated.

The support member 33 is located inside the casing 34, and the substrate holder 14 located in the casing 34 is placed on the support member 33. In other words, the support member 33 is formed in the form of one kind of disk, and the plurality of substrate holders 14 are placed on the support member 33 in a stacked manner. An upper end of the support member 33 is provided to pass through a through groove 34*c* formed in the casing 34.

In this case, the elastic body 32 is fitted in the support member 33.

The elastic body 32 elastically supports the plurality of substrate holders 14 placed on the support member 33 between the casing 34 and the support member 33 in a state of being fitted in the support member 33 so that the plurality of substrate holders 14 are located inside the casing 34.

The elastic body 32 may be provided as a spring having elasticity, but the present invention is not limited thereto.

A method of storing the substrate holder 14 in the storage unit 29 of the load-lock chamber 12 will be briefly described with reference to FIGS. 7 to 10.

First, the support member 33 is located inside the casing 34 of the storage unit 29. In this case, the support member 33 is located inside the casing 34 in a state in which the elastic body 32 is fitted in the support member 33.

When the substrate holder 14 is pushed into a lower end of the support member 33, the substrate holders 14 are stored inside the casing 34 in a stacked manner due to an elastic force of the elastic body 32.

In this case, as described above, as the bent part 34*b* bent in one direction is formed in the support groove 34*a* formed in the casing 34, the substrate holder 14 is located inside the casing 34 without being separated from the casing 34.

More simply, the substrate holders 14 are stacked and stored inside the casing 34 in the order of FIGS. 8, 9, and 10.

For reference, it is illustrated in the drawings that three substrate holders 14 are stored in one storage unit 29, the present invention is not necessarily limited thereto, and as the storage unit 29, that is, the depth of the casing 34, becomes larger, the number of the substrate holders 14 stored in the casing 34 may be increased.

Further, as described above, since the substrate 14*b* is coupled to the substrate holder 14, the substrate 14*b*, together with the substrate holders 14, is also stacked and stored in the storage unit 29.

Meanwhile, the load-lock chamber 12 is provided with a heater 31.

The heater 31 is a member for outgassing the substrate 14*b* stored in the load-lock chamber 12 before the thin film is grown.

There is an advantage in that a time required for growing the thin film in the thin film growth apparatus 10 may be reduced by outgassing the substrate 14*b* stored in the load-lock chamber 12 using the heater 31.

Meanwhile, referring to FIGS. 11 and 12, the thin film growth apparatus 10 according to the embodiment of the present invention may include at least one chamber support 36.

The chamber support 36 may be installed outside the growth chamber 11 to adjust an inclination of the thin film growth apparatus 10 with respect to one surface on which the thin film growth apparatus 10 is installed.

For example, as illustrated in FIG. 11, there is an advantage in that, when the chamber supports 36 are arranged outside the growth chamber 11 at different heights, even when the substrate holder 14 is dropped when the substrate 14*b* is moved, the thin film growth apparatus 10 can be used for a long time without failure.

Further, as illustrated in FIG. 12, there is an advantage in that, when the chamber support 36 is disposed vertically, an installation space for the thin film growth apparatus 10 can be reduced.

According to the above configuration, the MBE thin film growth apparatus 10 according to the embodiment of the present invention has an advantage in that, since the load-lock chamber 12 and the substrate manipulator 25 are arranged to face each other and arranged collinear with the substrate transfer path of the substrate transfer rod 24 that transfers the substrate 14*b* from the load-lock chamber 12 to the growth chamber 11 or from the growth chamber 11 to the load-lock chamber 12, a possibility that the substrate holder 14 is dropped while the substrate 14*b* is transferred is greatly reduced, and thus the thin film growth apparatus 10 can be used for a long time.

Further, in the MBE thin film growth apparatus 10 according to the present invention, since the substrate manipulator 25 itself rotates, the cause of a failure due to a short circuit of the heater 31 and a thermocouple (not illustrated) mounted on the substrate manipulator 25 is prevented, and thus the reliability of a thin film growth process can be improved.

As described above, the embodiment of the present invention has been described by specific matters such as detailed components, the limited embodiments, and the drawings. However, these are merely provided to help more general understanding of the present invention, the present invention is not limited to the above embodiments, and those skilled in the art to which the present invention pertains can derive various modifications and variations from this description. Thus, the spirit of the present invention should not be limited to the described embodiments, and not only the appended claims described below but also all of things equivalent to the claims and equivalently modified from the claims belong to the scope of the spirit of the present invention.

INDUSTRIAL APPLICABILITY

According to a molecular beam epitaxy (MBE) thin film growth apparatus related to an embodiment of the present invention, a substrate can be prevented from being dropped when the substrate is transferred, and the cause of the failure due to a short circuit of a heater or a thermocouple that heats the substrate.

The invention claimed is:

1. A molecular beam epitaxy (MBE) thin film growth apparatus comprising:
   a growth chamber which is connected to a vacuum pump and of which an inside is maintained in an ultra-high vacuum state;
   a substrate manipulator which is provided inside the growth chamber and on which a substrate is mounted;
   a load-lock chamber which is provided outside the growth chamber and communicates with the growth chamber and in which at least one substrate, which is mounted on the substrate manipulator, for growing a thin film is located; and
   a substrate transfer rod that transfers the substrate from the load-lock chamber to the growth chamber or from the growth chamber to the load-lock chamber,
   wherein the load-lock chamber is disposed to face the substrate manipulator and disposed collinear with a substrate transfer path of the substrate transfer rod,
   wherein the load-lock chamber further includes a substrate storage part in which at least one substrate that is moved to the growth chamber to grow the thin film is stored,
   wherein the substrate storage part further includes:
      a rotation member that is fixed to a center of the load-lock chamber and rotated in one direction or the other direction; and
      a plurality of storage units which are installed in the rotation member and in which a plurality of substrates are stored,
   wherein the rotation member is provided with a substrate movement part formed to pass through a portion at a location in which the storage unit is not installed, and
   when the substrate is to be moved from the load-lock chamber to the growth chamber or moved from the growth chamber to the load-lock chamber, the rotation member is rotated so that a substrate movement path of the substrate transfer rod and the substrate movement part are collinear with each other.

2. The MBE thin film growth apparatus of claim 1, wherein the growth chamber further includes an evaporation source mounting port on which at least one molecular beam effusion cell that generates an evaporation material for growing the thin film on the substrate mounted on the substrate manipulator is mounted therein,
   the evaporation source mounting port and the load-lock chamber are formed coplanar with the growth chamber, and
   the evaporation source mounting port is disposed obliquely with respect to the substrate transfer path of the substrate transfer rod.

3. The MBE thin film growth apparatus of claim 2, wherein the molecular beam effusion cell installed in an evaporation source port is disposed so that the evaporation material emitted from the molecular bean evaporation source faces the substrate manipulator, and
   the growth chamber is provided with an adjustment member for adjusting an amount of the evaporation material emitted toward the substrate manipulator.

4. The MBE thin film growth apparatus of claim 1, wherein a connection passage connecting the load-lock chamber and the growth chamber is opened or closed by a gate valve.

5. The MBE thin film growth apparatus of claim 1, wherein the substrate is fixed to a substrate holder, the substrate holder is provided with at least one coupling protrusion so that the substrate holder is coupled to the substrate manipulator and the substrate transfer rod, and the substrate transfer rod and the substrate manipulator are formed with at least one coupling groove provided in a shape corresponding to the coupling protrusion so that the coupling protrusion is fixedly inserted into the coupling groove.

6. The MBE thin film growth apparatus of claim 5, wherein a substrate connection part that facilitates coupling with the substrate holder is couped to the substrate transfer rod, and the substrate connection part is formed with at least one coupling groove corresponding to the coupling protrusion of the substrate holder.

7. The MBE thin film growth apparatus of claim 5, wherein, when the thin film is grown on the substrate, the substrate holder is moved from the load-lock chamber to the growth chamber by the substrate transfer rod in a state in which the coupling protrusion of the substrate holder is coupled to the coupling groove of the substrate connection part, the coupling protrusion is uncoupled from the coupling groove of the substrate connection part and is coupled to the coupling groove of the substrate manipulator, and thus the substrate holder is located inside the growth chamber, and when the thin film is completely grown on the substrate, the substrate holder is moved from the growth chamber to the load-lock chamber by the substrate transfer rod in a state in which the coupling protrusion of the substrate holder is uncoupled from the coupling groove of the substrate manipulator and is coupled to the coupling groove of the substrate connection part again.

8. The MBE thin film growth apparatus of claim 5, wherein the coupling groove is formed with a bent part bent in one side to prevent the fixedly inserted coupling protrusion from being separated.

9. The MBE thin film growth apparatus of claim 1, wherein rotation centers of the substrate transfer path of the substrate transfer rod and the rotation member are different from each other.

10. The MBE thin film growth apparatus of claim 1, wherein the storage unit includes:

a casing of which at least one end is formed as an open surface, in which the substrate holder is located, and which has at least one support groove in which the coupling protrusion of the substrate holder is fitted;

a support member which is located inside the casing and on which the substrate holder located in the casing is placed; and an elastic body which is located between the casing and the support member in a state of being fitted in the support member and elastically supports the plurality of substrate holders placed on the support member.

11. The MBE thin film growth apparatus of claim 10, wherein the load-lock chamber is provided with a heater for outgassing the substrate stored in the load-lock chamber.

12. The MBE thin film growth apparatus of claim 1, wherein the growth chamber is provided with a shutter for blocking foreign matter from adhering to the substrate mounted on the substrate manipulator, and the shutter is installed in a location near the substrate manipulator and installed to be rotatable toward the substrate manipulator.

13. The MBE thin film growth apparatus of claim 12, wherein the substrate manipulator is provided with a heating member installed to be rotatable with respect to the growth chamber in one direction or the other direction and configured to heat the mounted substrate.

14. The MBE thin film growth apparatus of claim 1, wherein the growth chamber is provided with a cooling member for decreasing a temperature of an inside of the growth chamber when the thin film is grown on the substrate.

15. The MBE thin film growth apparatus of claim 1, further comprising at least one chamber support provided to adjust an inclination of the MBE thin film growth apparatus with respect to one surface on which the MBE thin film growth apparatus is installed.

16. The MBE thin film growth apparatus of claim 1, wherein the load-lock chamber and the growth chamber are connected by a connection passage, when the thin film is grown on the substrate, and the substrate is mounted on the substrate manipulator by being moved from the load-lock chamber to the growth chamber along a substrate transfer path of linear through the connection passage opened by the substrate transfer rod, while the thin film is grown on the substrate, in a state in which the substrate transfer rod is out of the growth chamber along a substrate transfer path of linear, the connection passage is closed, and when the thin film is completely grown on the substrate, the connection passage is opened again, and the substrate is separated from the substrate manipulator along a substrate transfer path of linear through the connection passage opened by the substrate transfer rod and is moved from the growth chamber to the load-lock chamber.

* * * * *